United States Patent [19]

Goode et al.

[11] Patent Number: 4,815,126
[45] Date of Patent: Mar. 21, 1989

[54] TELEPHONE LINE SWITCH

[75] Inventors: Peter A. Goode, Winston Hills; David R. Stevenson, Chatswood, both of Australia

[73] Assignee: Alcatel N.V., Amsterdam, Netherlands

[21] Appl. No.: 887,170

[22] Filed: Jul. 17, 1986

[30] Foreign Application Priority Data

Jul. 18, 1985 [AU] Australia ............................ PH01533

[51] Int. Cl.[4] ............................................. H04M 1/31
[52] U.S. Cl. .................................... 379/359; 379/393; 379/412; 379/421
[58] Field of Search ............... 379/359, 355, 352, 393, 379/424, 412, 421

[56] References Cited

U.S. PATENT DOCUMENTS

| | | | |
|---|---|---|---|
| 2,774,888 | 12/1956 | Trousdale | 307/250 |
| 2,876,366 | 3/1959 | Hussey | 379/242 X |
| 2,972,683 | 2/1961 | Lunney | 379/273 X |
| 3,592,974 | 7/1971 | DiMassimo | 379/355 |
| 3,969,592 | 7/1976 | Pipitone et al. | 379/359 |
| 3,993,877 | 11/1976 | Sendyk et al. | 379/355 |
| 4,008,380 | 2/1977 | LaBorde | 379/353 |
| 4,063,045 | 12/1977 | Greischar | 379/98 |
| 4,163,159 | 7/1979 | Bachle et al. | 379/306 |
| 4,329,541 | 5/1982 | Gerber, Jr. | 178/3 |
| 4,341,991 | 7/1982 | Geboers et al. | 379/387 X |
| 4,360,710 | 11/1982 | Chaput et al. | 379/352 |
| 4,388,499 | 6/1983 | Janssen | 379/362 |
| 4,390,753 | 6/1983 | Janssen | 379/364 |
| 4,614,843 | 9/1986 | Coulmance | 379/352 |

FOREIGN PATENT DOCUMENTS

| | | | |
|---|---|---|---|
| 0009293 | 4/1980 | European Pat. Off. . | |
| 2742996 | 3/1979 | Fed. Rep. of Germany | 379/359 |
| 3205214 | 8/1983 | Fed. Rep. of Germany | 379/359 |
| 0159052 | 9/1983 | Japan | 379/359 |
| 0023663 | 2/1984 | Japan | 379/355 |
| 0140759 | 8/1984 | Japan | 379/355 |
| 839567 | 6/1960 | United Kingdom . | |
| 1574078 | 9/1980 | United Kingdom . | |
| 2117999 | 10/1983 | United Kingdom . | |
| 2132447 | 7/1984 | United Kingdom | 379/424 |

OTHER PUBLICATIONS

"LSI for Telecommunications", W. D. Pace, Telecommunications, Apr. 1984, pp. 43-46 and 48.

Primary Examiner—Thomas W. Brown
Attorney, Agent, or Firm—Spencer & Frank

[57] ABSTRACT

A solid state multi-function line switch for a telephone subset in which a controllable solid state switch in the subset's loop current circuit is controlled by a control circuit responsive to the telephone subset's signal functions such as hook-switch operation signals and loop current interrupt signals. An embodiment of a telephone subset circuit arrangement incorporating the line switch is disclosed.

28 Claims, 3 Drawing Sheets

TELEPHONE LINE SWITCH

BACKGROUND OF THE INVENTION

This invention relates to a telephone subset line switch, sometimes known as a 'Line Interface Circuit', which incorporates an electronic hook switch, usually in integrated circuit form.

Line switches of the aforementioned type are known and described in detail in, for example, the specification of Austrailian Patent Application No. 21,775/83. This specification describes a solid state switch for use as a hook-switch, comprising a field effect transistor whose gate/source potential is controlled by a bipolar transistor. Such a solid state hookswitch has an advantage over conventional mechanical hook-switches when "on hook dialling" is required, in that, expensive mechanically interlocked switches can be avoided.

The specification of Australian Patent Application No. 57,138/86 describes in detail a circuit arrangement in which the outpulsing transistor switch of a telephone subset's dialling circuit is utilized for generating a timed loop break recall signal. This known circuit arrangement has on the one hand, the advantage of obtaining a significant reduction of components by the characteristic utilization of the outpulsing transistor switch. But on the other hand, a conventional mechanical hook-switch is incorporated in the subset's circuit.

SUMMARY OF THE INVENTION

This specification discloses a solid state line switch for a telephone subset which may be controlled by one or more of the subset functions.

In one embodiment there is provided a telephone subset line switch, comprising input terminal means for coupling to the line terminals of a telephone subset circuit, and output terminal means for connection to the transmission circuit of said telephone subset circuit, a first semiconductor switch means having a controllable conductive path thereof serially connected between a first terminal of the said input terminal means and a first output of said output terminal means, a second semiconductor device having a controllable conductive path connected between the control element of the first semiconductor switch means and a second terminal of the input terminal means, said second input and second output terminals being common, and whose control element forms a first control input for coupling to control means associated with said transmission circuit for controllably switching said telephone subset's loop current circuit.

In another embodiment there is provided a telephone subset circuit arrangement incorporating the aforementioned line switch embodiment.

BRIEF DESCRIPTION OF THE DRAWINGS

In order that the invention may be readily carried into effect, it will now be described in detail by way of example with reference to the accompanying drawings in which.

DESCRIPTION OF THE PREFERRED EMBODIMENT

Figure 1:
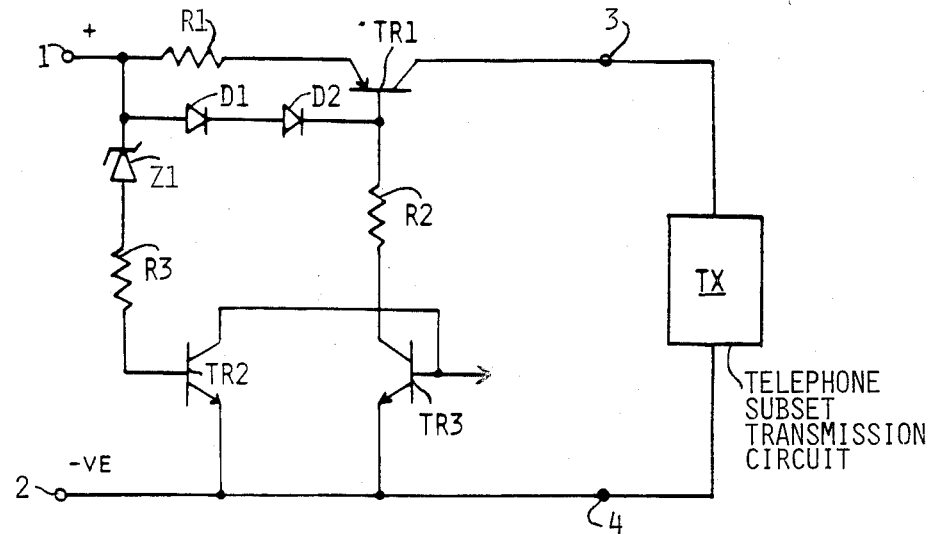
FIG. 1 is a circuit diagram of one form of a line switch of the present invention.

Referring to FIG. 1, there is shown a line switch circuit comprising output terminals 1 and 2 for connection to a telephone subset's line terminals via a polarity guard device (not shown) which ensures correct polarity irrespective of line polarity. The circuit further comprises input terminals 3 and 4 connected to the telephone subset's transmission circuit TX. Between terminals 1 and 3 is connected the collector/emitter path of a PNP transistor TR1 which is the main switching transistor. A resistor R1 is serially connected between terminal 1 and the collector element. The base element of transistor TR1 is coupled via resistor R2 to the collector element of an NPN transistor TR3 which is the control transistor. The emitter of transistor TR3 is connected to terminal 2 and the base element is coupled to control means (not shown) associated with transmission circuit TX. The base element of TR3 is also connected to the collector element of an NPN transistor TR2 which is the protection transistor. The base element of transistor TR2 is coupled to terminal 1 via resistor R3 and zener diode Z1. The conductive path of transistor TR1 is in series with the loop circuit of telephone transmission circuit TX and may be controllaby switched by control transistor TR3 with signals applied to the latter transistor base element by the control means. Over-current protection for elements of the transmission circuit TX is provided by resistor R1, typically 4.7 ohms, and diodes D1 and D2. Diode D2 compensates the emitter/base voltage drop of transistor TR1 so tha the voltage drop across resistor R1 is equal to the voltage drop across diode D1. Thus, when the current exceeds a value determined by the values of resistor R1 and diode D1 the base current of transistor TR1 is reduced causing the conductance of the emitter/collector junction of transistor TR1 to decrease, thereby limiting the loop current. Over voltage protection for the main switching transistor TR1 is provided by protection transistor TR2. Should the voltage across terminals 1 and 2 rise above a predetermined level, typically 150 V, zener diode Z1 begins to conduct and switches on transistor TR2 which in turn switches off control transistor TR3 and consequently transistor TR1. Transistor TR1 is thereby prevented from operating outside its safe operating area (SOA).

Figure 2:
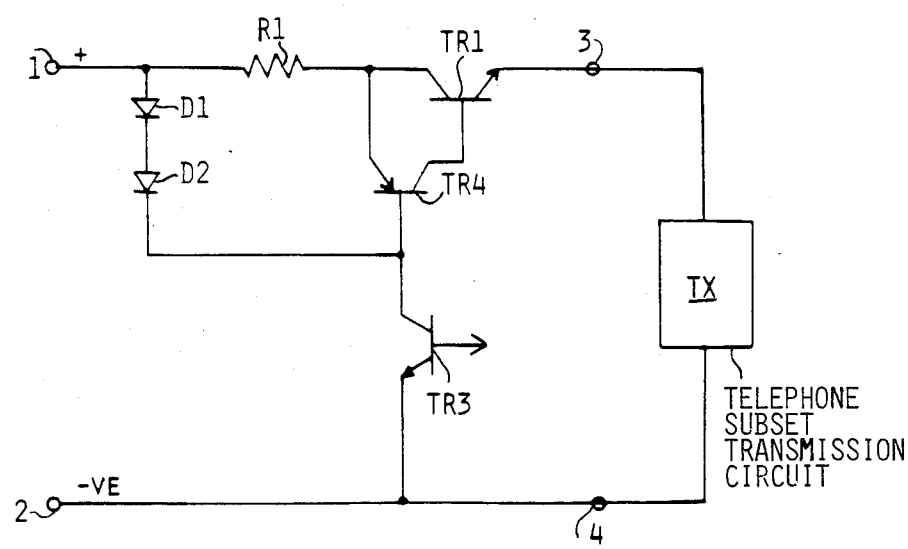
FIG. 2 shows a circuit diagram of another form of a line switch of the present invention.

Referring to FIG. 2, the line switch comprises a main switching transistor arrangement consisting of a complementary pair of transistors TR1 and TR4 whose switching is controlled by a control transistor TR3. The line switch includes overcurrent protection elements identical to those shown in FIG. 1, but omits the over voltage protection elements. Such a line switch may be used where overvoltage protection is provided by a clamping device across terminals 1 and 2, or where a suitable high voltage transistor is used for transistor TR1, such as, for example a high-voltage DMOS device, or a high voltage bipolar device.

Figure 3:
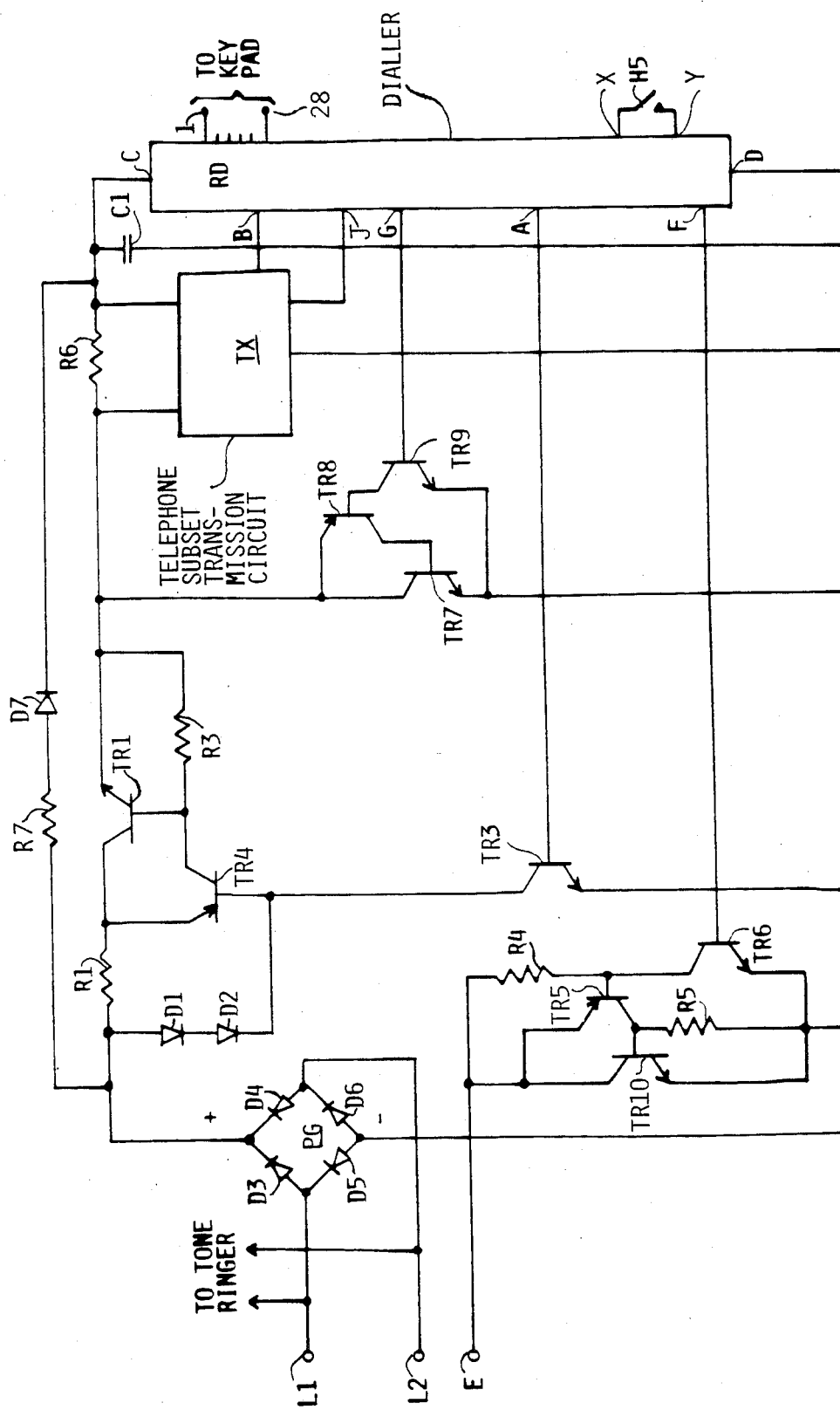
FIG. 3 shows a circuit diagram of a telephone subset incorporating a line switch of the present invention.

Referring now to FIG. 3, the telephone subset circuit comprises line terminals L1 and L2 connected across the AC points of a polarity guard device in the form of a diode bridge PG comprising diodes D3, D4, D5 and D6; It will be understood, however, that transistors, particularly field effect transistors, could substitute some or all of the diodes in the bridge, in which case it would be necessary to incorporate a polarity sensing control means. A tone ringer (not shown) is also connected across the line terminals. Across the DC points of bridge PG is a telephone transmission circuit TX having a load impedance resistor R6. Also connected across the DC points of bridge PG and in parallel with the transmission circuit TX is a dialler RD, which serves as a source of repertory tone/dial pulse signals. A dedicated chip such as the SHARP LR4806 may be employed as dialer RD, or a microprocessor could be utilized. Dialler RD includes a dial pulse output A, a mute signal output B, a power terminal C, common voltage rail terminal D, dual tone multifrequency (DTMF) output J, an earth recall/ground star output F, a DC characteristic adjustment signal or "kick-start" output G, a plurality of inputs 1-28 from the key-pad (not shown) associated with the subset, and inputs X and Y from the associated hook-switch HS. Also connected across the DC points of bridge PG and in parallel with repertory dialler RD is a storage capacitor C1 which provides power for repertory dialler RD during decadic dialling. A current bleed path is provided by resistor R7 and diode D7 connected between the DC positive point of the polarity guard PG and output C of dialler RD to provide power for the dialler when the subset is in the on-hook mode.

Serially connected between the DC positive point of polarity guard PG and the transmission circuit TX is the main switching path of the line switch circuit of FIG. 2, comprising a main switch in the form of a complementary configuration of transistors RT1 and TR4, a control transistor TR3 whose base element is connected to output A of dialler RD and the overcurrent protection elements resistor R1 and diodes D1 and D2.

Connected across the loop circuit is the main switching path of a shunt circuit for "kick start", comprising a main switch in the form of a complementary configuration of transistors TR7 and TR8, and a control transistor TR9 whose control element is connected to output G of dialler RD. Viewed from the line terminals L1 and L2, the shunt circuit is connected behind the line switch and before the transmission circuit TX. It will be understood, however, that the shunt circuit can be connected across the loop between the polarity guard PG and the line switch.

Connected to earth terminal E is the main switching path of the earth recall/ground start switching circuit, comprising a main switch in the form of a complementary configuration of transistors TR5 and TR10, and a control transistor TR6 whose base element is connected to output F of dialler RD.

In operation, when brought into the off-hook mode, the operation of hook switch contacts HS is sensed by dialler RD whereupon a mute signal is applied to output B which mutes the transmission circuit TX; a signal is applied to output G which turns on the control transistor TR9 of the shunt circuit which in turn switches on transistors TR8 and TR7; and a signal is applied to output A which turns on the control transistor TR3 of the line switch which in turn switches on transistors TR4 and TR1. Upon operation of transistor TR1 a current loop is provided via line terminal L1, positive point of polarity guard PG, resistor R1, collector/emitter junction of transistor TR1, collector/emitter junction of the shunt circuit transistor TR7, negative point of polarity guard PG to L2. The shunt circuit which effectively shunts the transmission circuit TX reduces the voltage drop of the loop circuit thereby providing a higher loop current to ensure exchange line relay operation on long line conditions. After a predetermined period, typically 400 m/s, the signal applied to output G of dialler RD is changed and control transistor TR9 of the shunt circuit is switched off which in turn switches off transistor TR8 and transistor TR7 whereupon the shunt circuit is removed and transmission circuit TX substitutes for the shunt circuit in the current loop. The signal applied to output B of dialler RD is changed and the muting is removed from the transmission circuit TX. Assuming that the dialler RD has been set in the pulse dialling mode, upon dialling, dial signals from the key pad are converted by dialler RD into corresponding trains of pulses which are applied via output A to the base of control transistor TR3 of the line switch, thereby pulsing the main switch transistors TR4 and TR1. Transistor TR1 makes and breaks the current loop to operate switching equipment at the exchange. To provide more reliable dial pulsing it can be arranged for the shunt circuit to be switched on by the dialler RD during dialling. The transmission circuit TX is muted during dialling by a signal on output B of dialler RD. If the exchange system to which the subset is connected provides a timed loop break (TLB) recall system, after the call has been established and the user desires to recall the exchange equipment, a designated key on the key pad is selectively operated. Its operation is sensed by dialler RD and the signal applied to output A of dialler RD is changed for a predetermined period, typically 90 m/s, which causes the control transistor TR3 of the line switch to switch off for 90 m/s which in turn switches off transistors TR4 and TR1. Transistor TR1 breaks the loop circuit for 90 m/s which is sensed by the exchange equipment, whereupon the exchange equipment is prepared for receiving further dialling signals.

If the dialler RD has been set in the DTMF mode, signals from the keypad cause dialler RD to generate a coded VF signal representing the digits keyed. The coded VF signal is applied to output J of dialler RD which is coupled to the line terminals L1 and L2 by a current source means (not shown) in the transmission circuit TX.

If the recall system associated with the exchange line equipment is an earth recall system, upon actuation of a designated recall key its operation is sensed by dialler RD which thereupon applies a signal to output F for at least 100 m/s. This signal switches on the control transistor TR6 of the earth recall/ground stand switching circuit, which in turn switches on transistors TR5 and TR10. Earth extended from the positive pole of the exchange battery to terminal E is thereby connected via the collector/emitter junction of transistor TR10 to the negative point of polarity guard PG and line terminal L2, and is sensed by the exchange equipment, whereupon the exchange equipment is prepared for further dialling signals. A timed loop break as described above will also be applied during earth recall. Under certain circumstances the additional TLB signal actually assists the earth recall operation.

In some telephone systems a ground start is required to sieze the exchange equipment prior to dialling. This is accomplished by momentarily applying an earth, extended from the earthed pole of the exchange battery, to a line terminal having the opposite pole potential, thereby unbalancing the line. Using the circuit of the present invention the ground start signal may be provided in a manner similar to the provision of the earth recall described above with a key designated for earth start. On the other hand the dialler RD could be programmed to provide the earth start signal at output F upon closing the contacts of the hook switch.

Figure 4:
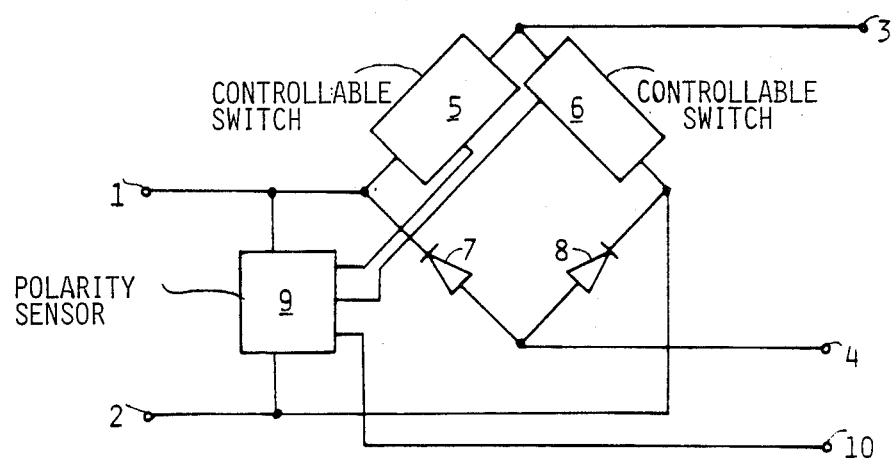
FIG. 4 shows a polarity guard incorporating the line switch.

FIG. 4 shows an embodiment of the line switch incorporating the polarity guard function. This arrangement is similar to a bridge diode in which one diode in each DC circuit has been replaced by a controllable switch (5,6) each of which may perform any or all of the functions previously described. The output of the bridge is fed to terminals 3 and 4 the bridge being supplied from line terminals 1 and 2 across which is a polarity sensing circuit 9 which switches the switches 5 and 6 on and off such that when terminal 1 is positive switch 5 is on and 6 is off and conversely if 2 is positive 6 is on and 5 is off. The polarity guard may incorporate a time delay to allow fleeting test reversals of the line voltage by the exchange test and supervisory equipment.

An additional terminal 10 is provided to give the desired telephone signalling controls. This may be done through polarity sensor 9 as shown or by further connections to switches 5 and 6, not shown.

In a further embodiment diodes 7 and 8 may be replaced by further switches and controlled so the switch replacing 7 is switched synchronously with 6, and 5 with 8.

Polarity sensor 9 may be applied across the output of the bridge as an alternative arrangement.

An arrangement such as shown in FIG. 4 may be used to replace the bridge rectifier of FIG. 3.

While the present invention has been described with regard to many particulars it is to be understood that equivalents may be readily substituted without departing from the scope of the invention.

The afore-described invention may be advantageously applied in the manufacture of telephone subset apparatus.

The claims defining the invention are as follows:

1. A telephone subset line switch comprising a first semiconductor switch means adapted to be connected in series with the loop circuit formed by the transmission circuit of a telephone subset and an exchange line, and wherein control means, responsive to two or more selected functions of the subset, generates signals to control the switching of the first semiconductor switch means to selectively switch the loop circuit open and closed appropriately for the selected functions, the first semiconductor switch means having a control element, and wherein one of the selected functions is hook-switch operation, the control means comprising second semiconductor switch means connected to the control element of the first semiconductor switch means, the second semiconductor switch means being controlled by function signal generating means in the telephone subset, the function signal generating means requiring operating power for operation and receiving the operating power when the subset is in the OFF-HOOK mode via the first semiconductor switch means, and wherein a capacitor bridges the function signal generating means to maintain the operating power for the function signal generating means during interruptions caused by function signalling when the first semiconductor switch means selectively switches the loop circuit open.

2. A line switch as claimed in claim 1 wherein a high impedance path bridges the line switch to maintain the operating power for the function signal generating means when the subset is in the ON-HOOK mode, wherein the transmission circuit has first and second ports disposed in the loop circuit, wherein the first semiconductor switch means comprises a pair of complementary transistors each having a respective control element, the first of the transistors having its main current path in the loop circuit and connected to the first port of the transmission circuit, the second transistor having its main current path connected between the control element of the first transistor and the loop circuit, the control element of the second transistor being the control element of the first semiconductor switch means, the second semiconductor switch means comprising a third transistor, the main current path of the third transistor connecting the control element of the second transistor to the second port of the transmission circuit.

3. A line switch as claimed in claim 2, wherein a loop current flows through the loop circuit when the first semiconductor switch means is selectively switched closed, and further including current limiting means having current sensing means to sense the loop current and cause the first semiconductor switch means to restrict the loop current to a selected maximum value when the loop current tends to exceed the maximum value.

4. A line switch as claimed in claim 3 in which the current limiting means comprises a small value resistor in series with the first semiconductor switch means and voltage clamping means connecting the side of the resistor remote from its junction with the first semiconductor switch means to the control element of the first semiconductor switch means in such a way that, when the voltage in the resistor due to the loop current exceeds a selected value, the voltage clamping means causes the first semiconductor switch means to prevent an increase in the loop current.

5. A polarity guard circuit in the form of a bridge rectifier wherein at least one arm of each conducting branch of the rectifier comprises a line switch as claimed in claim 2, the polarity guard circuit also including polarity sensing means sensing the polarity of the voltage on the exchange line, the sensing means providing an inhibit or an enable signal to appropriate ones of the line switches to ensure correct output polarity from the polarity guard circuit.

6. A line switch as claimed in claim 1, wherein a loop current flows through the loop circuit when the first semiconductor switch means is selectively switched closed, and further including current limiting means having current sensing means to sense the loop current and cause the first semiconductor switch means to restrict the loop current to a selected maximum value when the loop current tends to exceed the maximum value.

7. A line switch as claimed in claim 6 including voltage limiting means comprising voltage clamping means connecting a first of the wires of the exchange line to a control element of a third semiconductor switch means, the third semiconductor switch means connecting a control element of the second semiconductor switch means to a second wire of the exchange line whereby when the line voltage exceeds the limit of the voltage clamping means, the line switch is switched off.

8. A line switch as claimed in claim 6 in which the current limiting means comprises a small value resistor in series with the first semiconductor switch means and voltage clamping means connecting the side of the resistor remote from its junction with the first semiconductor switch means to the control element of the first semiconductor switch means in such a way that, when the voltage in the resistor due to the loop current exceeds a selected value, the voltage clamping means causes the first semiconductor switch means to prevent an increase in the loop current.

9. A line switch as claimed in claim 8 including voltage limiting means comprising voltage clamping means connecting a first of the wires of the exchange line to a control element of a third semiconductor switch means, the third semiconductor switch means connecting a control element of the second semiconductor switch means to a second wire of the exchange line whereby when the line voltage exceeds the limit of the voltage clamping means, the line switch is switched off.

10. A polarity guard circuit in the form of a bridge rectifier wherein at least one arm of each conducting branch of the rectifier comprises a line switch as claimed in claim 8, the polarity guard circuit also including polarity sensing means sensing the polarity of the voltage on the exchange line, the sensing means providing an inhibit or an enable signal to appropriate ones of the line switches to ensure correct output polarity from the polarity guard circuit.

11. A polarity guard circuit in the form of a bridge rectifier wherein at least one arm of each conducting branch of the rectifier comprises a line switch as claimed in claim 6, the polarity guard circuit also including polarity sensing means sensing the polarity of the voltage on the exchange line, the sensing means providing an inhibit or an enable signal to appropriate ones of the line switches to ensure correct output polarity from the polarity guard circuit.

12. A line switch as claimed in claim 1 including voltage limiting means comprising voltage clamping means connecting a first of the wires of the exchange line to a control element of a third semiconductor switch means, the third semiconductor switch means connecting a control element of the semiconductor switch means to a second wire of the exchange line whereby when the line voltage exceeds the limit of the second voltage clamping means, the line switch is switched off.

13. A polarity guard circuit in the form of a bridge rectifier wherein at least one arm of each conducting branch of the rectifier comprises a line switch as claimed in claim 12, the polarity guard circuit also including polarity sensing means sensing the polarity of the voltage on the exchange line, the sensing means providing an inhibit or an enable signal to appropriate ones of the line switches to ensure correct output polarity from the polarity guard circuit.

14. A line switch as claimed in claim 1 wherein a second of the function signals is dial pulsing operation.

15. A line switch as claimed in claim 1 wherein a second of the function signals is a timed-loop-break operation.

16. A line switch as claimed in claim 1 wherein there is an earth wire connecting the subset to an exchange and wherein the line switch includes earth recall means comprising another semiconductor switch means controlled by the control means to connect a wire of the exchange line to the earth wire.

17. A polarity guard circuit in the form of a bridge rectifier wherein at least one arm of each conducting branch of the rectifier comprises a line switch as claimed in claim 16, the polarity guard circuit also including polarity sensing means sensing the polarity of the voltage on the exchange line, the sensing means providing an inhibit or an enable signal to appropriate ones of the line switches to ensure correct output polarity from the polarity guard circuit.

18. A line switch as claimed in claim 1 including line seizure current sink means comprising a further semiconductor switch means bridging the transmission circuit of the telephone subset, the further semiconductor switch means being responsive to the control means to short circuit the transmission circuit for a predetermined period after the operation of the hook-switch.

19. A polarity guard circuit in the form of a bridge rectifier wherein at least one arm of each conducting branch of the rectifier comprises a line switch as claimed in claim 1, the polarity guard circuit also including polarity sensing means sensing the polarity of the voltage on the exchange line, the sensing means providing an inhibit or an enable signal to appropriate ones of the line switches to ensure correct output polarity from the polarity guard circuit.

20. A telephone subset for connection to a telephone line having at least first and second conductors, comprising:
control means, having first and second power supply terminals, having input terminals for receiving a hook-switch signal and telephone dialing information signals, and having output terminals, for providing telephone function signals at the output terminals in response to signals applied to the input terminals of the control means;
first path means for defining a first current path between the first conductor of the telephone line and the first power supply terminal of the control means, the first current path having an initial portion which is connected to the first conductor of the telephone line and having a final portion which is connected to the first power supply terminal of the control means, the first path means including a semiconductor switch between the initial and final portions of the first current path, the semiconductor switch having a control element;
means for providing a current bleed path between the initial and final portions of the first current path;
second path means for defining a second current path between the second conductor of the telephone line and the second power supply terminal of the control means;
a telephone subset transmission circuit connected between the final portion of the first current path and the second current path;
means, connecting an output terminal of the control means and the control element of the semiconductor switch, for selectively opening and closing the semicondcutor switch in response to a telephone function signal; and
a storage capacitor connected between the final portion of the first current path and the second current path.

21. The subset of claim 20, wherein the semiconductor switch comprises a pair of complementary transistors which are connected to one another, the base of one of the transistors being the control element of the semiconductor switch, and wherein the means for selectively opening and closing the semiconductor switch comprises a further transistor, the base of the further transistor being connected to an output terminal of the control means and one of the emitter and collector of the further transistor being connected to the control element of the semiconductor switch, the other of the emitter and collector of the further transistor being connected to the second current path.

22. The subset of claim 20, further comprising current limiting means for limiting the current through the semiconductor switch to a predetermined maximum value, the limiting means including a resistor in the initial portion of the first current path, and a plurality of diodes connected in series between the resistors and the control element of the semiconductor switch.

23. The subset of claim 20, wherein the means for selectively opening and closing the semiconductor switch comprises a transistor, and further comprising another transistor, one of the emitter and collector of the another transistor being connected to the base of the transistor and the other of the emitter and the collector of the another transistor being connected to the second current path, and further comprising means including a zener diode for connecting the base of the another transistor to the initial portion of the first current path.

24. The subset of claim 20, wherein the telephone function signals include a signal indicating whether the subset is an OFF-HOOK mode, and a dial pulsing signal.

25. The subset of claim 20, wherein the telephone function signals include a signal indicating whether the subset is an OFF-HOOK mode, and timed-loop-break operation signal.

26. The subset of claim 20, wherein the telephone line additionally includes a ground wire, and further comprising another semiconductor switch to selectively connect the ground wire to the second current path, the another semiconductor switch having a control element which is connected to an output terminal of the control means.

27. The subset of claim 20, further comprising line seizure current sink mans for shunting the transmission circuit for a predetermined period after the control means receives a hook-switch signal, the line seizure current sink means including an additional semiconductor switch connected between the final portion of the first current path and the second current path, the additional semiconductor switch having a control element that is connected to an output terminal of the control means.

28. The subset of claim 20, wherein the first path means includes a first diode connected to the first conductor of the telephone line and the second path means includes a second diode connected to the second conductor of the telephone line, and further comprising third and fourth diodes connected to the first and second diodes to form a diode bridge

* * * * *